(12) United States Patent
Chen

(10) Patent No.: US 11,600,549 B2
(45) Date of Patent: Mar. 7, 2023

(54) TACTILE REPRESENTATION DEVICE, DISPLAY PANEL AND DISPLAY DEVICE

(71) Applicant: BOE Technology Group Co., Ltd., Beijing (CN)

(72) Inventor: Yuju Chen, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/489,632

(22) Filed: Sep. 29, 2021

(65) Prior Publication Data
US 2022/0165642 A1    May 26, 2022

(30) Foreign Application Priority Data
Nov. 24, 2020  (CN) ......................... 202011333604.X

(51) Int. Cl.
| | | |
|---|---|---|
| *H01L 23/38* | (2006.01) | |
| *H01L 35/32* | (2006.01) | |
| *G06F 3/01* | (2006.01) | |
| *H01L 27/32* | (2006.01) | |
| *G06F 3/041* | (2006.01) | |
| *H01L 35/22* | (2006.01) | |

(52) U.S. Cl.
CPC .............. *H01L 23/38* (2013.01); *G06F 3/016* (2013.01); *G06F 3/0412* (2013.01); *H01L 27/323* (2013.01); *H01L 35/22* (2013.01); *H01L 35/32* (2013.01)

(58) Field of Classification Search
None
See application file for complete search history.

(56) References Cited

U.S. PATENT DOCUMENTS

| | | | |
|---|---|---|---|
| 2021/0126170 A1* | 4/2021 | Chen | ........................ H01L 33/58 |
| 2022/0109084 A1* | 4/2022 | Kuo | ........................ H01L 35/02 |

* cited by examiner

*Primary Examiner* — Stephen T. Reed
(74) *Attorney, Agent, or Firm* — IPro, PLLC

(57) ABSTRACT

A tactile representation device is provided. The tactile representation device includes a substrate and a semiconductor temperature control assembly disposed on the substrate. The substrate includes a plurality of deformable regions and a plurality of node regions that are alternately disposed in a first direction, wherein the deformable regions are deformable but the node regions are not deformable. The semiconductor temperature control assembly includes a plurality of semiconductor temperature control units. Each of the semiconductor temperature control units includes a hot terminal electrode, a P-side electrode, an N-side electrode, a P-type semiconductor, and an N-type semiconductor. Each of the hot terminal electrodes is disposed in each of the deformable regions, and each of the P-side electrodes and each of the N-side electrodes are disposed in each of the node regions.

20 Claims, 6 Drawing Sheets

TACTILE REPRESENTATION DEVICE, DISPLAY PANEL AND DISPLAY DEVICE

CROSS REFERENCE TO RELATED APPLICATION

This application claims priority to Chinese Patent Application No. 202011333604.X, filed on Nov. 24, 2020, and entitled "TACTILE REPRESENTATION DEVICE, DISPLAY PANEL AND DISPLAY DEVICE," the content of which is incorporated by reference herein in its entirety as part of the present application.

TECHNICAL FIELD

The present disclosure relates to the technical field of tactile representation, and in particular, relates to a tactile representation device, a display panel, and a display device.

BACKGROUND

As an emerging human-computer interaction technology, the surface tactile representation technology can perceive object characteristics by touching the screen with bare fingers, and realize efficient and natural interaction on multimedia terminals, which is of great research significance. The surface tactile representation technology is to dispose a vibration source (for example, a piezoelectric ceramic chip) on a carrier plane, such that the carrier is mechanically deformed due to resonance and a certain friction force is formed, thereby simulating different tactility.

It should be noted that information disclosed in the above Background is used merely for a better understanding of the background of the present disclosure, and therefore may include information that does not constitute the related art known to persons of ordinary skill in the art.

SUMMARY

According to a first aspect of embodiments of the present disclosure, a tactile representation device is provided. The tactile representation device includes:

a substrate, including a plurality of deformable regions and a plurality of node regions that are alternately disposed in a first direction, wherein the substrate is vibratable to cause the deformable regions to be deformed, and the node regions are not deformed; and a semiconductor temperature control assembly, including a plurality of semiconductor temperature control units disposed on a side of the substrate along the first direction, wherein each of the semiconductor temperature control units includes a hot terminal electrode, a P-side electrode, an N-side electrode, a P-type semiconductor, and an N-type semiconductor; wherein each of the hot terminal electrodes is disposed in each of the deformable regions, each of the P-side electrode and each of the N-side electrodes are disposed in each of the node regions, the P-type semiconductor is connected to the P-side electrode and the hot terminal electrode, and the N-type semiconductor is connected to the N-side electrode and the hot terminal electrode.

In some embodiments, in each of the semiconductor temperature control units, the P-side electrode includes a first P-side electrode and a second P-side electrode, the N-side electrode includes a first N-side electrode and a second N-side electrode, the P-type semiconductor includes a first P-type semiconductor and a second P-type semiconductor, and the N-type semiconductor includes a first N-type semiconductor and a second N-type semiconductor; and the hot terminal electrode is disposed in one deformable region; the first P-side electrode and the first N-side electrode are disposed in a node region on a side of the hot terminal electrode, the first P-type semiconductor is connected to the first P-side electrode and the hot terminal electrode, and the first N-type semiconductor is connected to the first N-side electrode and the hot terminal electrode; and the second P-side electrode and the second N-side electrode are disposed in a node region on the other side of the hot terminal electrode, the second P-type semiconductor is connected to the second P-side electrode and the hot terminal electrode, and the second N-type semiconductor is connected to the second N-side electrode and the hot terminal electrode.

In some embodiments, in two adjacent semiconductor temperature control units in the first direction, a first P-side electrode and a first N-side electrode in one semiconductor temperature control unit and a second P-side electrode and a second N-side electrode in the other semiconductor temperature control unit are disposed in a same node region.

In some embodiments, the first P-side electrode and the second P-side electrode disposed in the same node region are connected as a whole or independent of each other, and the first N-side electrode and the second N-side electrode disposed in the same node region are connected as a whole or independent of each other.

In some embodiments, a plurality of semiconductor temperature control assemblies are included, wherein the plurality of semiconductor temperature control assemblies are disposed along a second direction, wherein the second direction is different from the first direction.

In some embodiments, in two adjacent semiconductor temperature control units in the second direction, a first P-side electrode in one semiconductor temperature control unit and a first N-side electrode in the other semiconductor temperature control unit are connected as a whole, and a second P-side electrode in one semiconductor temperature control unit and a second N-side electrode in the other semiconductor temperature control unit are connected as a whole.

In some embodiments, the second direction is perpendicular to the first direction; or the first direction is a radial direction, and the second direction is a circumferential direction.

In some embodiments, the hot terminal electrode is a transparent electrode.

In some embodiments, a material of the hot terminal electrode is semiconductor indium tin oxide or graphene.

In some embodiments, the N-side electrode and the P-side electrode are both metal electrodes.

In some embodiments, the tactile representation device further includes:

a thermally conductive layer, disposed on a side of the hot terminal electrode facing away from the substrate and covering at least the deformable regions.

In some embodiments, a surface of the thermally conductive layer facing away from the substrate is an uneven surface.

In some embodiments, a material of the thermally conductive layer is any one or more of aluminum nitride, boron nitride, silicon carbide, magnesium oxide, and aluminum oxide.

In some embodiments, a surface of the substrate facing away from the semiconductor temperature control assembly is an uneven surface.

According to a second aspect of embodiments of the present disclosure, a display panel is provided. The display panel includes:

a back plate and a cover plate disposed opposite to each other;

a light emitting device, disposed between the back plate and the cover plate; and the tactile representation device as described above, wherein the tactile representation device is disposed on a side of the cover plate, and the semiconductor temperature control assembly is disposed on a side of the cover plate facing towards or away from the back plate.

In some embodiments, the substrate of the tactile representation device and the cover plate are an integral structure.

In some embodiments, the display panel further includes a touch electrode disposed between the light emitting device and the cover plate, the semiconductor temperature control assembly is disposed on a side of the cover plate facing towards the back plate, and the hot terminal electrode serves as the touch electrode.

According to a third aspect of embodiments of the present disclosure, a display device is provided. The display device includes a power supply assembly and the display panel as described above, wherein the power supply assembly is configured to supply power to the display panel.

It should be understood that the above general description and the following detailed description are only exemplary and explanatory, and should not be construed as a limitation to the present disclosure.

BRIEF DESCRIPTION OF THE DRAWINGS

The accompanying drawings, which are incorporated in and constitute a part of this description, illustrate the embodiments of the present disclosure and together with the description, serve to explain the principles of the present disclosure. Apparently, the accompanying drawings in the following description show merely some embodiments of the present disclosure, and persons of ordinary skill in the art may still derive other drawings from these accompanying drawings without creative efforts.

REFERENCE NUMERALS AND DENOTATIONS THEREOF

Figure 1:
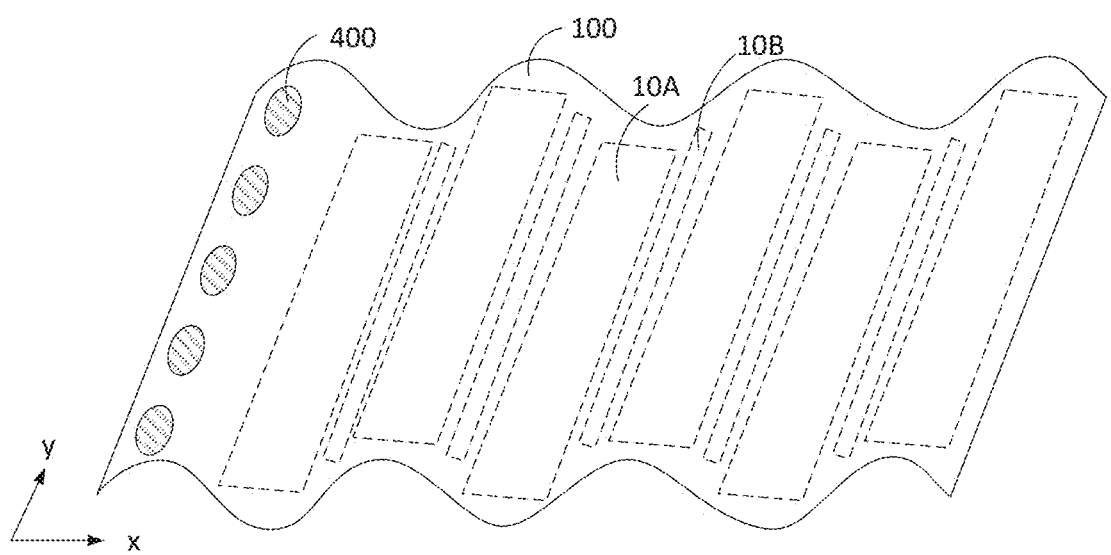
FIG. 1 is a schematic diagram of a form of a substrate during resonance.

100: substrate; 10A: deformable region; 10B: node region; 200: semiconductor temperature control assembly; 20: semiconductor temperature control unit; 21: hot terminal electrode; 22: P-side electrode; 221: first P-side electrode; 222: second P-side electrode; 23: N-side electrode; 231: first N-side electrode; 232: second N-side electrode; 24: P-type semiconductor; 241: first P-type semiconductor; 242: second P-type semiconductor; 25: N-type semiconductor; 251: first N-type semiconductor; 252: second N-type semiconductor; 300: thermally conductive layer; 400: piezoelectric ceramic sheet; 500: back plate; 600: cover plate; 700: light emitting device; 00: power supply assembly; 01: display panel.

DETAILED DESCRIPTION OF THE EMBODIMENTS

The exemplary embodiments are described fully below with reference to the accompanying drawings. The exemplary embodiments may be implemented in various forms, and may not be construed as being limited to those described herein. On the contrary, these exemplary embodiments are provided to make the present disclosure comprehensive and complete and to fully convey the concept manifested therein to those skilled in the art. The same reference numerals in the figures indicate the same or similar structures, and thus their detailed descriptions will be omitted.

When the human body touches the surface of an object, in addition to the mechanical signals, temperature sensation signals can also be perceived, such that the surface characteristics of the object are more accurately and thoroughly perceived. However, because the specific heat of the carrier material is fixed, temperature sensation of a single material can be felt, which is relatively single. Moreover, when the carrier resonates, it will generate heat due to its damping during vibration. The heat will shift the resonance efficiency and the resonance peak and affect the accuracy of tactile simulation. In addition, due to different deformations, the surface heat of the carrier is unevenly distributed.

An embodiment of the present disclosure provides a tactile representation device. With reference to FIG. 1 to FIG. 4, the tactile representation device of the embodiment of the present disclosure includes a substrate 100 and a semiconductor temperature control assembly 200 disposed on the substrate 100.

The substrate 100 is a vibration carrier, and a vibration source is disposed on the substrate 100. The substrate 100 can resonate under the drive of the vibration source (for example, a piezoelectric ceramic sheet 400). In this embodiment, as shown in FIG. 1, the vibration source is formed of a plurality of piezoelectric ceramic sheets 400 disposed along a second direction y, and the piezoelectric ceramic sheets 400 can cause the surface of the substrate 100 to form a resonance as shown in the figure. The substrate 100 is divided, based on the form of the substrate 100 during vibration, into a plurality of strip-shaped deformable regions 10A and a plurality of strip-shaped node regions 10B that are alternately disposed in a first direction x. The first direction x may be perpendicular to the second direction y. The deformable regions 10A are deformed, and the node regions 10B are not deformed.

Figure 2:
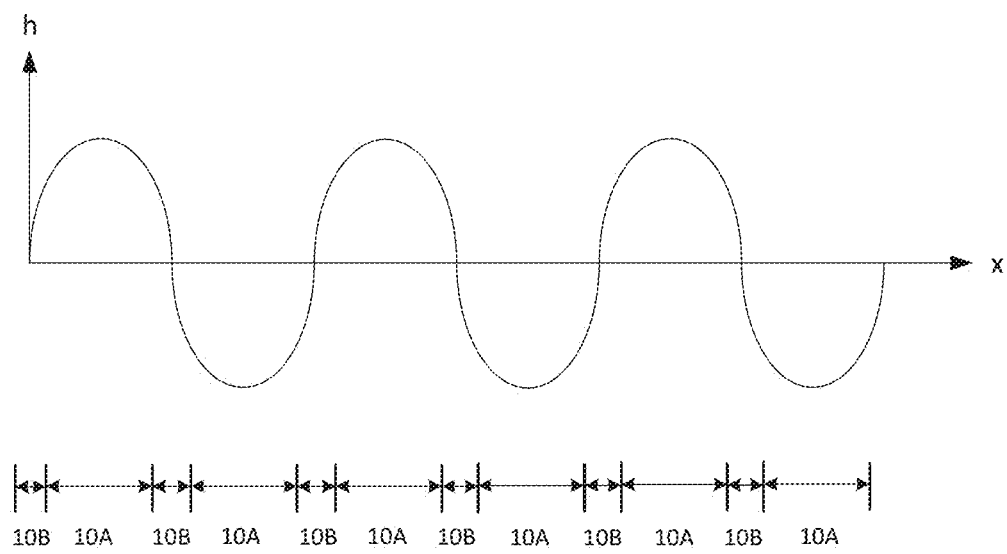
FIG. 2 is a standing wave diagram of a sine wave formed on a surface of a substrate during resonance.

FIG. 2 shows a vibration curve formed on the surface of the substrate 100 in the vibration mode of FIG. 1. In this embodiment, the vibration curve is a standing wave curve of a sine wave. In FIG. 2, the abscissas represent vibration positions of the substrate 100 along the first direction x, and the ordinates represent displacements h of the vibration positions of the substrate 100. As shown in FIG. 2, the deformable regions 10A correspond to parts of the standing wave curve disposed above and below the abscissa axis, and the node regions 10B correspond to intersections between the standing wave curve and the abscissa axis.

Figure 3:
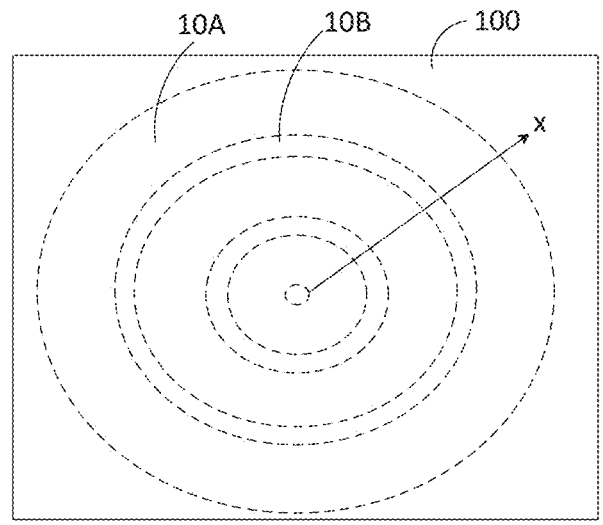
FIG. 3 is another schematic diagram of a form of a substrate during resonance.

In some embodiments, the substrate may also present different vibration forms depending on different parameters such as the vibration mode and position of the vibration source, such that the user feels different tactile sensations. For example, the vibration form of the substrate may alternatively be concentric circles as shown in FIG. 3, that is, vibrating outward from the center of the substrate. In addition, on a cross section of any radius, the vibration curve is as shown in FIG. 2. In this case, the substrate may alternatively be divided into a plurality of ring-shaped deformable regions 10A and a plurality of ring-shaped node regions 10B that are alternately disposed in the first direction x (a direction facing away from the center of the circle). The deformable regions 10A are deformed, and the node regions 10B are not deformed.

In some embodiments, the vibration form of the substrate may be any other form. Regardless of the form, the alternately disposed deformable regions 10A and node regions 10B exist. The deformable regions 10A will alternately present wave peaks and troughs, and the position of the node regions 10B remain unchanged. The temperature of the deformable regions 10A is higher, while the temperature of the node regions 10B is lower.

It should be noted that, strictly, only one point that is not deformed is provided. In fact, due to the continuous transition of the deformation magnitudes, for the convenience of description, a region where the deformation magnitude is within a smaller threshold range can be regarded as a region that is not deformed, that is, the node region 10B is a narrow region. The deformable region 10A generates heat due to its own damping effect. A greater deformation indicates a higher temperature. The node region 10B has a lower temperature.

Figure 4:
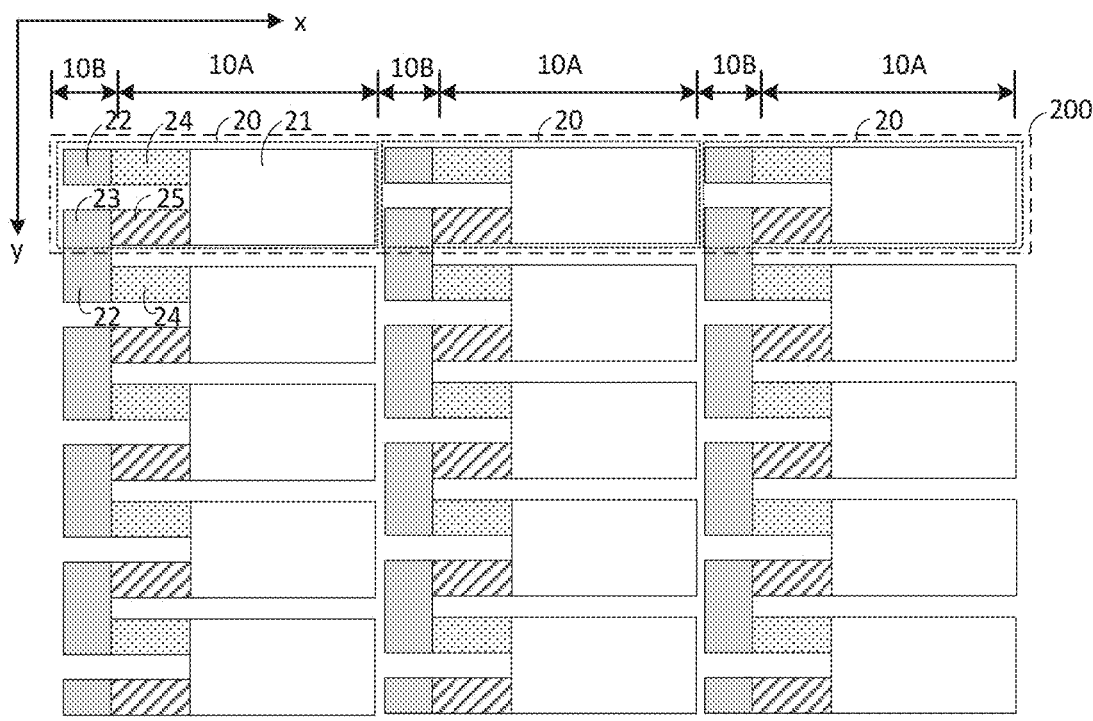
FIG. 4 is a schematic structural diagram of a semiconductor temperature control assembly according to a first embodiment of the present disclosure.

Referring to FIG. 4, the semiconductor temperature control assembly 200 includes a plurality of semiconductor temperature control units 20 disposed on the substrate 100 along the first direction x. Each of the semiconductor temperature control units 20 includes a hot terminal electrode 21, a P-side electrode 22, an N-side electrode 23, a P-type semiconductor 24, and an N-type semiconductor 25. The P-type semiconductor 24 is connected to the P-side electrode 22 and the hot terminal electrode 21, and the N-type semiconductor 25 is connected to the N-side electrode 23 and the hot terminal electrode 21.

The working principle of the semiconductor temperature control unit 20 is as follows: The P-type semiconductor 24 and the N-type semiconductor 25 are connected to form a thermocouple, forming a P-N junction. When a direct current passes through this P-N junction, energy transfer occurs due to the existence of thermoelectric power. The hot terminal electrode 21 is disposed at the higher-temperature end, the P-side electrode 22 and the N-side electrode 23 are disposed at the lower-temperature end, and the current moves in the electrodes and the semiconductors, such that the heat of the hot terminal electrode 21 is transferred to the P-side electrode 22 and the N-side electrode 23, finally realizing equilibrium.

In one aspect, because the hot terminal electrode 21 is disposed in each of the deformable regions 10A, and the P-side electrode 22 and the N-side electrode 23 are disposed in each of the node regions 10B, the heat generated in the deformable region 10A is transferred to the node region 10B. In this way, the overall heat of the substrate 100 can be evenly distributed, and the resonance efficiency and resonance peaks are not affected by excessive local heat, thereby ensuring the accuracy of the tactile simulation.

It can be understood that both the P-type semiconductor 24 and the N-type semiconductor 25 are configured to connect the electrode of the deformable region 10A and the electrodes of the node region 10B, and their positions differ based on the size of the electrodes. To be specific, the P-type semiconductor 24 and the N-type semiconductor 25 may be disposed in the deformable region 10A, may be disposed in the node region 10B, or may be disposed across the two regions.

In another aspect, because the heat transfer is driven by the direct current, the heat transfer is controlled by controlling the magnitude of the current, and further the temperature is controlled. Because a region touched by the finger is the deformable region 10A, the temperature of the deformable region 10A and the rise and fall of the temperature can be controlled by controlling the magnitude of the current. In this way, temperature sensations generated by the interfaces with different specific heat and/or different thermal conductivities are simulated to realize the tactile perception of different temperature sensations and improve the richness of the tactile representation technology.

In some embodiments, the peak or trough position in the deformable regions 10A is the highest temperature point, the node region 10B is the lowest temperature point, and the distance between the peak or trough position and the node region 10B is ¼ of the vibration wavelength. Because the half-wavelength of tactile sensation does not exceed 20 mm, the distance between high-temperature and low-temperature regions may be up to 10 mm. In other words, the distance between the peak or trough position and the node region 10B may be up to 10 mm. Because the semiconductor temperature control unit 20 in this embodiment of the present disclosure is disposed horizontally, the temperature of the substrate 100 with relatively large deformation can be controlled, to avoid the shift of the resonance peak due to excessive heat. In addition, the positive and negative Thomson effect can be achieved by an external power supply/capacitor.

Figure 6:
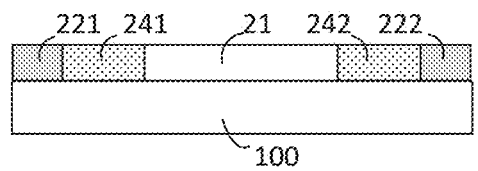
FIG. 6 is a cross-sectional view of a structure of a semiconductor temperature control unit in FIG. 5.

In some embodiments, as shown in FIG. 6, the semiconductor temperature control assembly 200 may be disposed on the substrate 100, and a side of the semiconductor temperature control assembly 200 facing away from the substrate 100 is a finger touch surface. In some other embodiments, the semiconductor temperature control assembly 200 may be disposed under the substrate 100, and a surface of the substrate 100 facing away from the semiconductor temperature control assembly 200 is a finger touch surface.

In some embodiments, the semiconductor temperature control assembly 200 and the vibration source may be disposed on the same surface of the substrate 100 or may be disposed on different surfaces of the substrate 100.

The tactile representation device according to this embodiment of the present disclosure is described in detail below with an example of the vibration form shown in FIG. 1 and an example in which the semiconductor temperature control assembly 200 is disposed on the substrate 100.

FIG. 4 is a schematic top view of a semiconductor temperature control assembly 200 according to a first embodiment. In this embodiment, three semiconductor temperature control units 20 are schematically disposed in the first direction x to equalize the temperature of the deformable regions 10A disposed on the substrate 100 in the first direction x.

One semiconductor temperature control unit 20 is used as an example. Each of the semiconductor temperature control units 20 includes a hot terminal electrode 21, a P-side electrode 22, an N-side electrode 23, a P-type semiconductor 24, and an N-type semiconductor 25. The P-type semiconductor 24 is connected to the P-side electrode 22 and the hot terminal electrode 21, and the N-type semiconductor 25 is connected to the N-side electrode 23 and the hot terminal electrode 21. In this embodiment, the semiconductor temperature control unit 20 has an asymmetric structure. For example, the P-side electrode 22 and the N-side electrode 23 are disposed only on the left side of each of the semiconductor temperature control units 20. It can be understood that the P-side electrode 22 and the N-side electrode 23 may alternatively be disposed on the right side of the hot terminal electrode 21.

Figure 5:
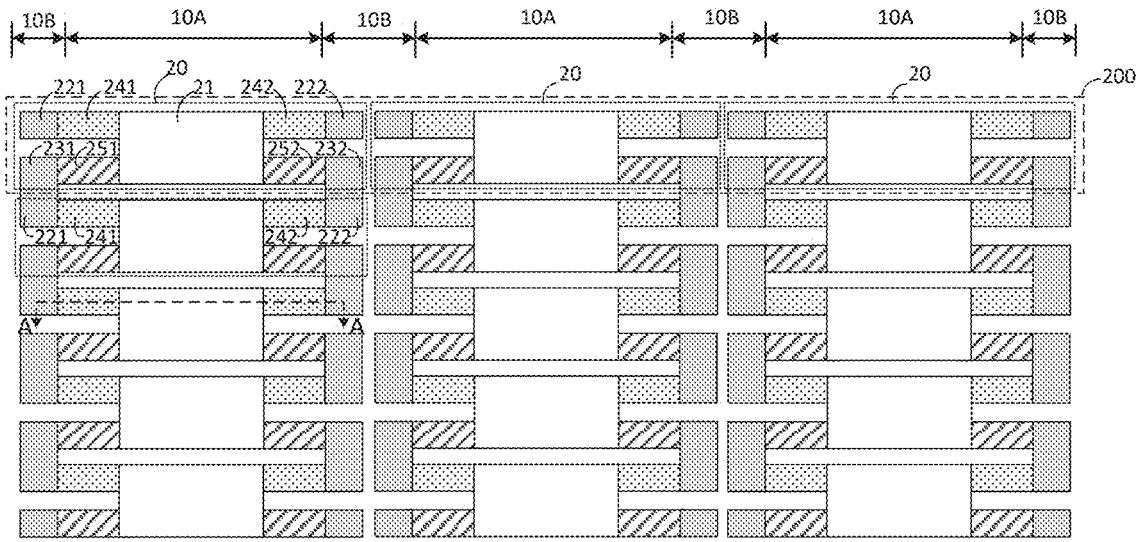
FIG. 5 is a schematic structural diagram of a semiconductor temperature control assembly according to a second embodiment of the present disclosure.

FIG. 5 is a schematic top view of a semiconductor temperature control assembly 200 according to a second embodiment. FIG. 6 is a schematic cross-sectional view of A-A in FIG. 5. With reference to FIG. 5 and FIG. 6, it can be seen that the semiconductor temperature control unit 20 has a left-right symmetrical structure. The P-side electrode 22 includes a first P-side electrode 221 and a second P-side electrode 222. The N-side electrode 23 includes a first N-side electrode 231 and a second N-side electrode 232. The P-type semiconductor 24 includes a first P-type semiconductor 241 and a second P-type semiconductor 242. The N-type semiconductor 25 includes a first N-type semiconductor 251 and a second N-type semiconductor 252.

One semiconductor temperature control unit 20 is used as an example. With reference to FIG. 5 and FIG. 6, the hot terminal electrode 21 is disposed in one deformable region 10A. The first P-side electrode 221 and the first N-side electrode 231 are disposed in a node region 10B on the left side of the hot terminal electrode 21. The first P-type semiconductor 241 is connected to the first P-side electrode 221 and the hot terminal electrode 21, and the first N-type semiconductor 251 is connected to the first N-side electrode 231 and the hot terminal electrode 21. The second P-side electrode 222 and the second N-side electrode 232 are disposed in a node region 10B on the right side of the hot terminal electrode 21. The second P-type semiconductor 242 is connected to the second P-side electrode 222 and the hot terminal electrode 21, and the second N-type semiconductor 252 is connected to the second N-side electrode 232 and the hot terminal electrode 21.

Heat can be transferred to both the left and right parts of the symmetrical semiconductor temperature control unit 20, that is, the heat of the deformable region 10A disposed in the middle can be transferred to the node regions 10B on the left and right sides separately, to improve the temperature equalization rate.

In the first direction x, because each of two adjacent semiconductor temperature control units 20 has a symmetrical structure, a first P-side electrode 221 and a first N-side electrode 231 in one semiconductor temperature control unit 20 and a second P-side electrode 222 and a second N-side electrode 232 in the other semiconductor temperature control unit 20 may be disposed in a same node region 10B. In the structure shown in this embodiment, the first P-side electrode 221 and the second P-side electrode 222 disposed in the same node region 10B may be independent of each other, and the first N-side electrode 231 and the second N-side electrode 232 disposed in the same node region 10B may be independent of each other.

Figure 7:
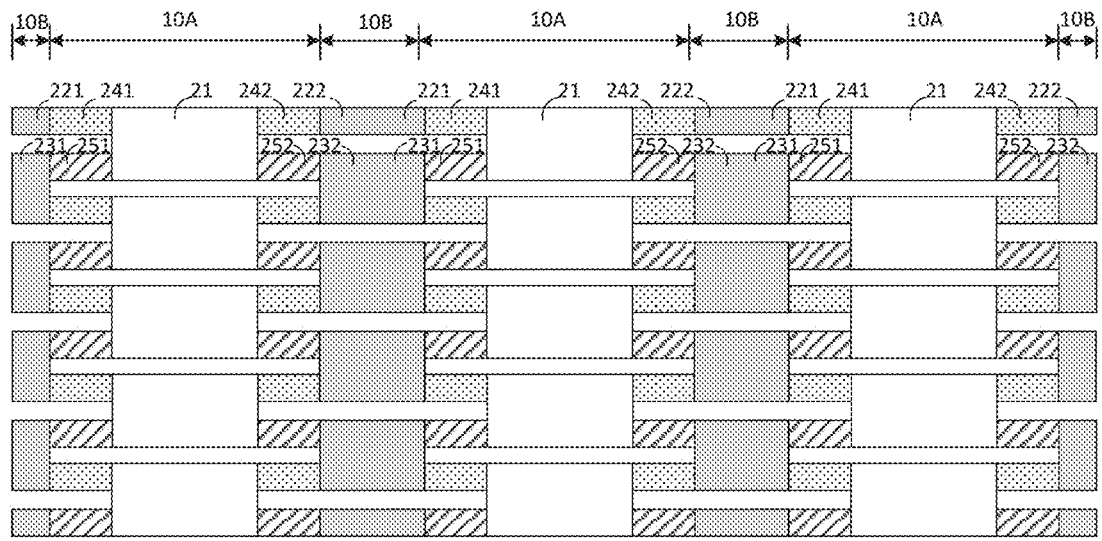
FIG. 7 is a schematic structural diagram of a semiconductor temperature control assembly according to a third embodiment of the present disclosure.

FIG. 7 is a schematic structural diagram of a semiconductor temperature control assembly 200 according to a third embodiment. Different from FIG. 5, in this embodiment, the first P-side electrode 221 and the second P-side electrode 222 disposed in the same node region 10B are connected as a whole. In addition, the first N-side electrode 231 and the second N-side electrode 232 disposed in the same node region 10B are also connected as a whole.

In the above three embodiments, a plurality of semiconductor temperature control assemblies 200 are included. Referring to FIG. 4, the plurality of semiconductor temperature control assemblies 200 are disposed along the second direction y, that is, all the semiconductor temperature control units 20 are disposed in an array, such that heat dissipation is implemented for the entire substrate 100.

In two adjacent semiconductor temperature control units 20 in the second direction y, a first P-side electrode 221 in one semiconductor temperature control unit 20 and a first N-side electrode 231 in the other semiconductor temperature control unit 20 are connected as a whole. In addition, a second P-side electrode 222 in one semiconductor temperature control unit 20 and a second N-side electrode 232 in the other semiconductor temperature control unit 20 are also connected as a whole. In this way, the semiconductor temperature control units 20 in the second direction y are connected in series, and all the semiconductor temperature control units 20 cover the entire substrate 100. All positions on the substrate 100 are dissipated and the temperature is even, such that the temperature of the entire substrate 100 is balanced.

Figure 8:
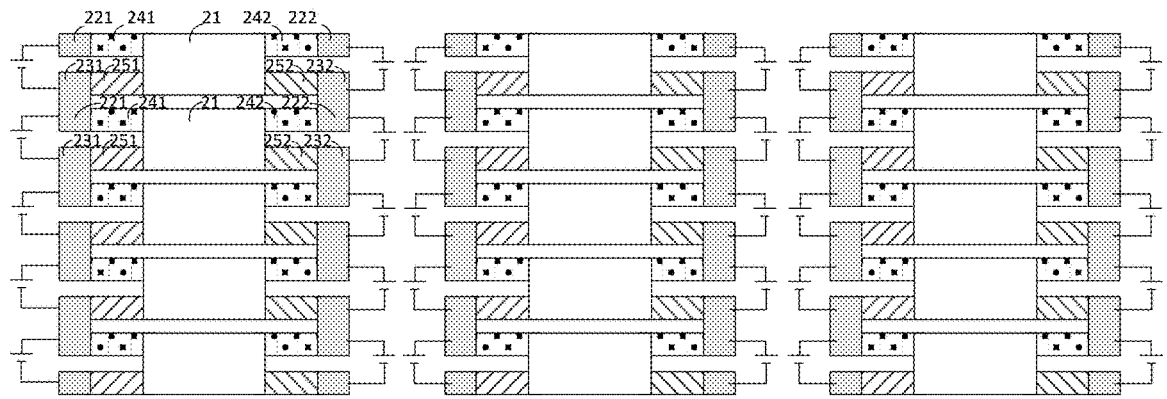
FIG. 8 is a schematic diagram of a first connection between a semiconductor temperature control assembly and a power supply according to an embodiment of the present disclosure.
Figure 9:
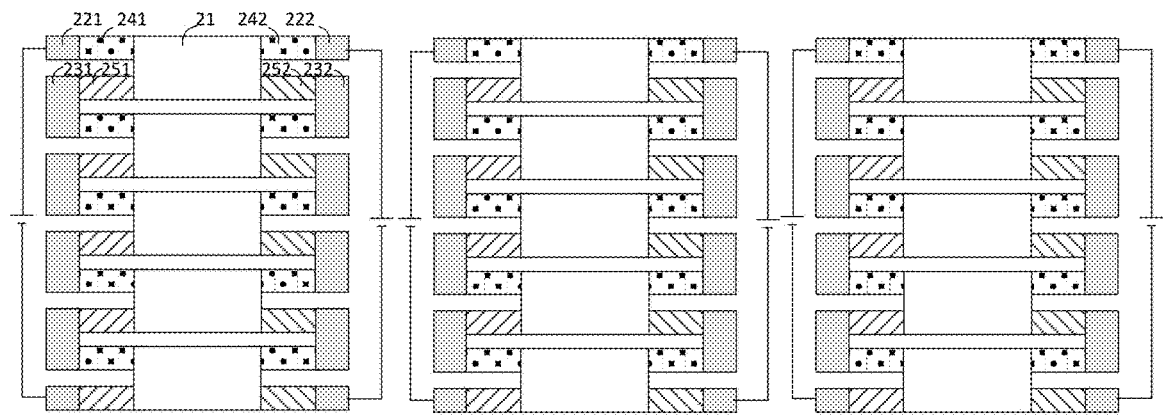
FIG. 9 is a schematic diagram of a second connection between a semiconductor temperature control assembly and a power supply according to an embodiment of the present disclosure.
Figure 10:
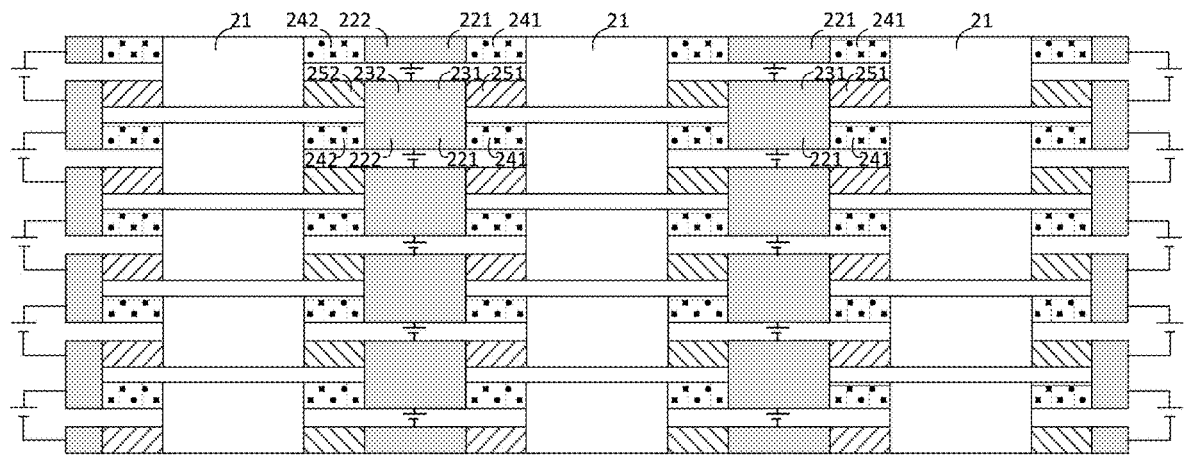
FIG. 10 is a schematic diagram of a third connection between a semiconductor temperature control assembly and a power supply according to an embodiment of the present disclosure.

The semiconductor temperature control units 20 need to be connected to a power supply. For one semiconductor temperature control unit 20, the positive pole of the power supply is connected to the N-side electrode 23, and the negative pole of the power supply is connected to the P-side electrode 22. When the semiconductor temperature control units 20 are disposed in an array, a plurality of ways are available for connection to the power supply, and in all these ways, heat transfer is implemented. FIG. 8 to FIG. 10 are schematic diagrams of different connection modes between the semiconductor temperature control assembly 200 and the power supply.

As shown in FIG. 8, the semiconductor temperature control assembly 200 with the structure in FIG. 5 is used as an example. A first N-side electrode 231 and a first P-side electrode 221 of each of the semiconductor temperature control units 20 may be respectively connected to the positive and negative poles of a power supply. A second N-side electrode 232 and a second P-side electrode 222 on the other side of the symmetry structure may be respectively connected to the positive and negative poles of a power supply.

As shown in FIG. 9, the semiconductor temperature control assembly 200 with the structure in FIG. 5 is stilled used as an example. In all the semiconductor temperature control units 20 disposed along the second direction y, the N-side electrodes 23 and the P-side electrodes 22 on the left side may be connected in series to a power supply. That is, the $1^{st}$ first N-side electrode 231 is connected to the positive pole of the power supply, and the last first P-side electrode 221 is connected to the negative pole of the power supply. The N-side electrode 23 and the P-side electrode 22 on the other side (that is, the right side) of the symmetry structure are also connected in series to a power supply.

As shown in FIG. 10, the semiconductor temperature control assembly 200 with the structure in FIG. 7 is used as an example. In the first direction x, the first P-side electrode 221, the second P-side electrode 222, the first N-side electrode 231 and the second N-side electrode 232 disposed in a same node region 10B are connected as a whole electrode. One end of each of the adjacent integral electrodes in the second direction y may be connected to the positive pole of one power supply, and the other end may be connected to the negative pole of another power supply.

In the embodiments of the present disclosure, because the hot terminal electrode 21 is disposed in the deformable region 10A and occupies a relatively large area, a transparent electrode is preferably used in order to not affect the display screen and to achieve visual effects. A specific material may be semiconductor indium tin oxide (ITO) or graphene. Because the P-side electrode and the N-side electrode are only disposed in the node region 10B and occupy a small area, metal electrodes may be used. A material of the metal electrodes may be a metal or an alloy composed of a plurality of metals, or may be formed by a plurality of metal film layers. For example, the metal electrode may be a three-layer film structure formed by Ni, Cu, and Au, which has low electrical resistance and good thermal conductivity. Optionally, the thickness of the metal electrode may be set to 500 nm to 3 μm.

Figure 11:
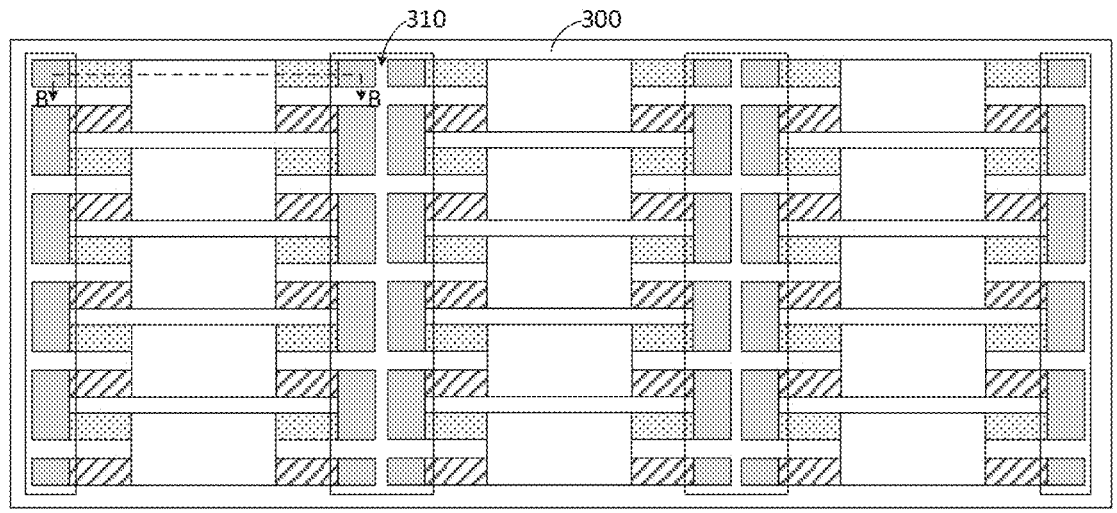
FIG. 11 is a top view of a tactile representation device including a thermally conductive layer according to an embodiment of the present disclosure.
Figure 12:
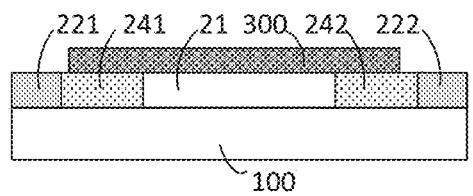
FIG. 12 is a cross-sectional view of a tactile representation device including a thermally conductive layer according to an embodiment of the present disclosure.

The tactile representation device may further include a thermally conductive layer 300. Referring to FIG. 11 and FIG. 12, FIG. 11 is a top view of the tactile representation device including the thermally conductive layer 300, and FIG. 12 is a schematic cross-sectional view of B-B in FIG. 11. The thermally conductive layer 300 is provided on a side of the hot terminal electrode 21 facing away from the substrate 100. In this case, a surface touched by the finger is a side of the thermally conductive layer 300 facing away from the substrate 100. The thermally conductive layer 300 is made of a thermally conductive material, for example, aluminum nitride, boron nitride, silicon carbide, magnesium oxide or aluminum oxide. The thermally conductive layer 300 covers at least the deformable regions 10A, which plays a role of large-area heat transfer, to avoid surface temperature accumulation and improve thermal equilibrium efficiency.

In some embodiments, as shown in FIG. 11, the thermally conductive layer 300 is provided with an opening 310, and the opening 310 exposes the P-side electrode 22 and the N-side electrode 23 below, to facilitate connection with an external power line. FIG. 11 shows only one type of opening, and the opening may alternatively be in other forms, which is not particularly limited in the present disclosure.

Figure 13:
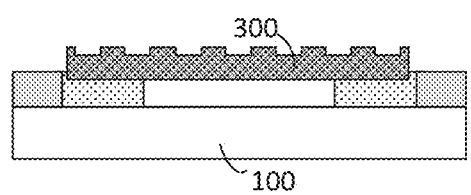
FIG. 13 is a schematic diagram of a thermally conductive layer with an uneven surface according to an embodiment of the present disclosure.

In some embodiments, referring to FIG. 13, the surface of the thermally conductive layer 300 facing away from the substrate 100 is an uneven surface, which can increase the surface area of the thermally conductive layer 300 and improve the heat dissipation effect. In addition, when the thermally conductive layer 300 is a finger contact surface, the uneven surface can also increase the tactile contact area or change the surface roughness, to further improve the tactile characteristics.

As shown in FIG. 13, the uneven surface may be a surface with a plurality of protrusions uniformly distributed, and the protrusions may be disposed regularly or irregularly. The shape of the protrusion may be a rectangle as shown in the figure, or may be any other shape such as a cone or a circle. When the thermally conductive layer 300 of this structure is prepared, first, a tape casting process may be used to form an entire surface. Then, plasma etching is used with a mask for etching, or the photoresist after exposure and development may be used as a mask for etching. Certainly, other methods may also be used for preparation, and the specific process is not specifically limited in this application.

Figure 14:
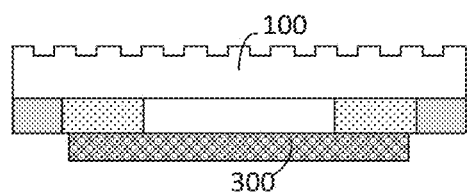
FIG. 14 is a schematic diagram of a substrate with an uneven surface according to an embodiment of the present disclosure.

In some embodiments, referring to FIG. 14, when the finger contact surface is the side of the substrate 100 facing away from the thermally conductive layer 300, the semiconductor temperature control assembly 200 is disposed below the substrate 100, and the thermally conductive layer 300 is disposed on a side of the semiconductor temperature control assembly 200 facing away from the substrate 100. In some other embodiments, an uneven surface may be formed on the back of the substrate 100 to improve the heat dissipation effect and increase the tactile contact area or change the surface roughness. The uneven surface structure on the back of the substrate 100 is similar to the surface structure of the thermally conductive layer 300, and is not be described in detail herein.

The structural design of the semiconductor temperature control assembly 200 in the vibration mode shown in FIG. 1 is described in the above embodiments. For other vibration modes shown in FIG. 3, the semiconductor temperature control assembly 200 may alternatively adopt the structure shown in FIG. 4, FIG. 5, or FIG. 7 to dispose the semiconductor temperature control units 20 in the deformable regions 10A and the node regions 10B.

It can be understood that, in the embodiment shown in FIG. 3, the first direction x refers to any direction facing away from the center of the circle, that is, a radial direction of any radius, and the second direction y is a direction surrounding the center of the circle, that is, the circumferential direction. In addition, the width of the semiconductor temperature control unit 20 near the center of the circle is smaller, and the width of the semiconductor temperature control unit 20 facing away from the center of the circle is larger, to cover more area and achieve good heat dissipation. The width of the semiconductor temperature control unit 20 may refer to the size of the semiconductor temperature control unit 20 in the second direction y.

Figure 15:
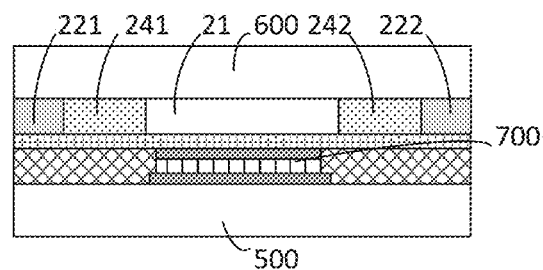
FIG. 15 is a schematic structure diagram of a display panel according to an embodiment of the present disclosure.

An embodiment of the present disclosure further provides a display panel. As shown in FIG. 15, the display panel includes a back plate 500 and a cover plate 600, and a light emitting device 700 disposed between the back plate 500 and the cover plate 600. The light emitting device 700 shown in FIG. 15 is an OLED light emitting device 700, which includes an anode layer, an organic light emitting functional layer and a cathode layer disposed in an opening of a pixel defining layer. The OLED light emitting device 700 is encapsulated and protected by an encapsulation layer. The cover plate 600 is on the OLED light emitting device 700.

The display panel further includes the tactile representation device according to the above embodiments, and the tactile representation device is disposed on a side of the cover plate 600. The semiconductor temperature control assembly 200 in the tactile representation device may be disposed on a side of the cover plate 600 facing towards the back plate 500, or may be disposed on a side facing away from the back plate 500.

In some embodiments, the substrate 100 of the tactile representation device and the cover plate 600 of the display panel may be an integrated structure. In some other embodiments, it may be understood as that the substrate 100 of the tactile representation device is the cover plate 600 in FIG. 15. In other words, the semiconductor temperature control assembly 200 and the vibration source are both disposed on the cover plate 600. In this way, the display panel can not only display images, but also has the function of tactile representation. It should be understood that, because the hot terminal electrode 21 may be a transparent electrode, it will not affect the normal display of the panel.

It can be understood that when the semiconductor temperature control assembly 200 is disposed on a side of the cover plate 600 facing towards the back plate 500, the surface of the cover plate 600 is the finger touch surface. When the semiconductor temperature control assembly 200 is disposed on a side of the cover plate 600 facing away from the back plate 500, the surface of the semiconductor temperature control assembly 200 is the finger touch surface. Both methods can dissipate heat from the cover plate 600.

In some embodiments, the display panel is a touch display panel, which includes a touch film layer disposed on the cover plate 600, and the touch film layer includes touch electrodes. When the semiconductor temperature control assembly 200 is disposed on the side of the cover plate 600 facing towards the back plate 500, the hot terminal electrode 21 of the semiconductor temperature control assembly 200 serves as the touch electrode. In this way, the cover plate 600 serves as a touch display surface and a tactile sensing surface.

Figure 16:
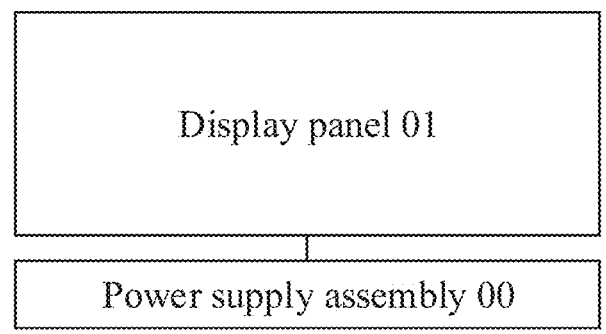
FIG. 16 is a schematic structural diagram of a display device according to an embodiment of the present disclosure.

An embodiment of the present disclosure further provides a display device. As shown in FIG. 16, the display device includes a power supply assembly 00 and the display panel 01 according to the above embodiment. The power supply assembly 00 is configured to supply power to the display panel 01. It can be understood that the display device also achieves the technical effects of the display panel.

some embodiments, the power supply assembly 00 may include at least one of a battery and a power circuit.

The type of the display device is not specifically limited in this embodiment of the present disclosure, which may be any product or assembly with a display function, for example, a TV, a notebook computer, a tablet computer, a wearable display device, a mobile phone, or an e-book.

The above embodiments applied to the display field are described. The applicability of the piezoelectric ceramic chip is not specifically limited in the present disclosure. It may be applied to a display device for display and tactile representation, and may also be applied to experimental equipment or testing equipment in other fields.

Although relative terms such as "above" and "below" are used in this specification to describe the relative relationship between one assembly and another assembly in the figures, these terms are used in this specification only for convenience, for example, according to the example directions in the accompanying drawings. It can be understood that if the devices in the figures are turned upside down, the "above" assembly becomes the "below" assembly. When a structure is "above" another structure, it may mean that the structure is integrally formed on the other structure, or the structure is "directly" disposed on the other structures, or the structure is "indirectly" disposed on the other structure through another structure.

The terms "an," "a," "the," "said," and "at least one" are used to indicate one or more elements/assemblies or the like. The terms "include," "have," and derivatives thereof are intended to indicate inclusive including, and implies other elements/assemblies or the like in addition to the listed elements/assemblies or the like.

A person skilled in the art may easily conceive of other embodiment solutions of the present disclosure upon considering the specification and practicing the content disclosed herein. The present disclosure is intended to cover any variations, purposes or applicable changes of the present disclosure. Such variations, purposes, or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

What is claimed is:

1. A tactile representation device, comprising:
a substrate, comprising a plurality of deformable regions and a plurality of node regions that are alternately disposed in a first direction, wherein the substrate is vibratable to cause the deformable regions to be deformed, and the node regions are not deformed; and
a semiconductor temperature control assembly, comprising a plurality of semiconductor temperature control units disposed on a side of the substrate along the first direction, wherein each of the semiconductor temperature control units comprises a hot terminal electrode, a P-side electrode, an N-side electrode, a P-type semiconductor, and an N-type semiconductor; and
each of the hot terminal electrodes is disposed in each of the deformable regions, each of the P-side electrodes and each of the N-side electrodes are disposed in each of the node regions, the P-type semiconductor is connected to the P-side electrode and the hot terminal electrode, and the N-type semiconductor is connected to the N-side electrode and the hot terminal electrode.

2. The tactile representation device according to claim 1, wherein in each of the semiconductor temperature control units, the P-side electrode comprises a first P-side electrode and a second P-side electrode, the N-side electrode comprises a first N-side electrode and a second N-side electrode, the P-type semiconductor comprises a first P-type semiconductor and a second P-type semiconductor, and the N-type semiconductor comprises a first N-type semiconductor and a second N-type semiconductor;
the hot terminal electrode is disposed in one of the deformable regions;

the first P-side electrode and the first N-side electrode are disposed in a node region on one side of the hot terminal electrode, the first P-type semiconductor is connected to the first P-side electrode and the hot terminal electrode, and the first N-type semiconductor is connected to the first N-side electrode and the hot terminal electrode; and the second P-side electrode and the second N-side electrode are disposed in a node region on the other side of the hot terminal electrode, the second P-type semiconductor is connected to the second P-side electrode and the hot terminal electrode, and the second N-type semiconductor is connected to the second N-side electrode and the hot terminal electrode.

3. The tactile representation device according to claim 2, wherein in two adjacent semiconductor temperature control units in the first direction, a first P-side electrode and a first N-side electrode in one semiconductor temperature control unit and a second P-side electrode and a second N-side electrode in the other semiconductor temperature control unit are disposed in a same node region.

4. The tactile representation device according to claim 3, wherein the first P-side electrode and the second P-side electrode disposed in the same node region are connected as a whole or independent of each other, and the first N-side electrode and the second N-side electrode disposed in the same node region are connected as a whole or independent of each other.

5. The tactile representation device according to claim 2, wherein the tactile representation device comprises a plurality of semiconductor temperature control assemblies, wherein the plurality of semiconductor temperature control assemblies are disposed along a second direction, the second direction being different from the first direction.

6. The tactile representation device according to claim 5, wherein in two adjacent semiconductor temperature control units in the second direction, a first P-side electrode in one semiconductor temperature control unit and a first N-side electrode in the other semiconductor temperature control unit are connected as a whole, and a second P-side electrode in one semiconductor temperature control unit and a second N-side electrode in the other semiconductor temperature control unit are connected as a whole.

7. The tactile representation device according to claim 5, wherein the second direction is perpendicular to the first direction.

8. The tactile representation device according to claim 5, wherein the first direction is a radial direction, and the second direction is a circumferential direction.

9. The tactile representation device according to claim 1, wherein the hot terminal electrode is a transparent electrode.

10. The tactile representation device according to claim 1, wherein a material of the hot terminal electrode is semiconductor indium tin oxide or graphene.

11. The tactile representation device according to claim 1, wherein the N-side electrode and the P-side electrode are both metal electrodes.

12. The tactile representation device according to claim 1, further comprising:

a thermally conductive layer, disposed on a side of the hot terminal electrode facing away from the substrate and covering at least the deformable regions.

13. The tactile representation device according to claim 12, wherein a surface of the thermally conductive layer facing away from the substrate is an uneven surface.

14. The tactile representation device according to claim 12, wherein a material of the thermally conductive layer is any one or more of aluminum nitride, boron nitride, silicon carbide, magnesium oxide, and aluminum oxide.

15. The tactile representation device according to claim 1, wherein a surface of the substrate facing away from the semiconductor temperature control assembly is an uneven surface.

16. The tactile representation device according to claim 4, wherein the tactile representation device comprises a plurality of semiconductor temperature control assemblies, wherein the plurality of semiconductor temperature control assemblies are disposed along a second direction, the second direction being perpendicular to the first direction;

in two adjacent semiconductor temperature control units in the second direction, a first P-side electrode in one semiconductor temperature control unit and a first N-side electrode in the other semiconductor temperature control unit are connected as a whole, and a second P-side electrode in one semiconductor temperature control unit and a second N-side electrode in the other semiconductor temperature control unit are connected as a whole;

the hot terminal electrode is a transparent electrode, and a material of the hot terminal electrode is semiconductor indium tin oxide or graphene; and the N-side electrode and the P-side electrode are both metal electrodes; and the tactile representation device further comprises:

a thermally conductive layer, disposed on a side of the hot terminal electrode facing away from the substrate and covering at least the deformable regions, wherein a material of the thermally conductive layer is any one or more of aluminum nitride, boron nitride, silicon carbide, magnesium oxide, and aluminum oxide; and a surface of the thermally conductive layer facing away from the substrate and a surface of the substrate facing away from the semiconductor temperature control assembly are both uneven surfaces.

17. A display panel, comprising:

a back plate and a cover plate disposed opposite to each other;

a light emitting device, disposed between the back plate and the cover plate; and a tactile representation device, disposed on a side of the cover plate, wherein the tactile representation device comprises:

a substrate, comprising a plurality of deformable regions and a plurality of node regions that are alternately disposed in a first direction, wherein the substrate is vibratable to cause the deformable regions to be deformed, and the node regions are not deformed; and a semiconductor temperature control assembly, comprising a plurality of semiconductor temperature control units disposed on a side of the substrate along the first direction, wherein each of the semiconductor temperature control units comprises a hot terminal electrode, a P-side electrode, an N-side electrode, a P-type semiconductor, and an N-type semiconductor; wherein each of the hot terminal electrodes is disposed in each of the deformable regions, each of the P-side electrodes and each of the N-side electrodes are disposed in each of the node regions, the P-type semiconductor is connected to the P-side electrode and the hot terminal electrode, and the N-type semiconductor is connected to the N-side electrode and the hot terminal electrode; and the semiconductor temperature control assembly is disposed on a side of the cover plate facing towards or away from the back plate.

18. The display panel according to claim 17, wherein the substrate of the tactile representation device and the cover plate are an integral structure.

19. The display panel according to claim 17, wherein the display panel further comprises a touch electrode disposed between the light emitting device and the cover plate, the semiconductor temperature control assembly is disposed on a side of the cover plate facing towards the back plate, and the hot terminal electrode serves as the touch electrode.

20. A display device, comprising a power supply assembly and a display panel, wherein the power supply assembly is configured to supply power to the display panel, and the display panel comprises:
- a back plate and a cover plate disposed opposite to each other;
- a light emitting device, disposed between the back plate and the cover plate; and
- a tactile representation device, disposed on a side of the cover plate, wherein the tactile representation device comprises:
- a substrate, comprising a plurality of deformable regions and a plurality of node regions that are alternately disposed in a first direction, wherein the substrate is vibratable to cause the deformable regions to be deformed, and the node regions are not deformed; and
- a semiconductor temperature control assembly, comprising a plurality of semiconductor temperature control units disposed on a side of the substrate along the first direction, wherein each of the semiconductor temperature control units comprises a hot terminal electrode, a P-side electrode, an N-side electrode, a P-type semiconductor, and an N-type semiconductor; wherein each of the hot terminal electrodes is disposed in each of the deformable regions, each of the P-side electrodes and each of the N-side electrodes are disposed in each of the node regions, the P-type semiconductor is connected to the P-side electrode and the hot terminal electrode, and the N-type semiconductor is connected to the N-side electrode and the hot terminal electrode; and
- the semiconductor temperature control assembly is disposed on a side of the cover plate facing towards or away from the back plate.

* * * * *